United States Patent [19]
Kuehnle et al.

[11] Patent Number: 5,679,412
[45] Date of Patent: Oct. 21, 1997

[54] METHOD AND APPARATUS FOR PRODUCING GAS IMPERMEABLE, CHEMICALLY INERT CONTAINER STRUCTURES FOR FOOD AND VOLATILE SUBSTANCES

[75] Inventors: Manfred R. Kuehnle, New London, N.H.; Arno Hagenlocher, Santa Rosa, Calif.; Klaus Schuegraf, Torrance, Calif.; Hermann Statz, Wayland, Calif.

[73] Assignee: Manfred R. Kuehnle, New London, N.H.

[21] Appl. No.: 595,342

[22] Filed: Feb. 1, 1996

Related U.S. Application Data

[60] Division of Ser. No. 421,536, Apr. 13, 1995, abandoned, which is a continuation-in-part of Ser. No. 342,368, Nov. 28, 1994, Pat. No. 5,527,386, which is a continuation-in-part of Ser. No. 144,249, Oct. 28, 1993, Pat. No. 5,534,056.

[51] Int. Cl.$^6$ .................................................. C23C 14/02
[52] U.S. Cl. ............. 427/534; 118/723 R; 118/723 VE; 118/723 MW; 427/237; 427/238; 427/248.1; 427/255.3; 427/255.7; 427/296; 427/307; 427/322; 427/419.2; 427/419.7; 427/536; 427/585; 427/595

[58] Field of Search .................. 427/534, 536, 427/585, 595, 237, 238, 296, 307, 322, 248.1, 255.3, 255.7, 419.2, 419.7; 118/723 R, 723 VE, 723 MW

[56] References Cited

U.S. PATENT DOCUMENTS

| 5,338,580 | 8/1994 | Katagiri et al. | 427/576 |
| 5,468,520 | 11/1995 | Williams et al. | 427/579 |

*Primary Examiner*—Bernard Pianalto
*Attorney, Agent, or Firm*—Cesari and McKenna

[57] ABSTRACT

A method of making a gas-impermeable, chemically inert container wall structure comprising the steps of providing a base layer of an organic polymeric material; conducting a pair of reactive gases to the surface of the base layer preferably by pulsed gas injection; heating the gases preferably by microwave energy pulses sufficiently to create a plasma which causes chemical reaction of the gases to form an inorganic vapor compound which becomes deposited on the surface, and continuing the conducting and heating until the compound vapor deposit on the surface forms a gas-impermeable, chemically inert barrier layer of the desired thickness on the surface. Various wall structures and apparatus for making them are also disclosed.

20 Claims, 5 Drawing Sheets

METHOD AND APPARATUS FOR PRODUCING GAS IMPERMEABLE, CHEMICALLY INERT CONTAINER STRUCTURES FOR FOOD AND VOLATILE SUBSTANCES

This application is a division of Ser. No. 08/421,536, filed Apr. 13, 1995, abandoned, which is a continuation-in-part of Ser. No. 08/342,368, filed Nov. 28, 1994, U.S. Pat. No. 5,527,386, which is a continuation-in-part of Ser. No. 08/144,249, filed Oct. 28, 1993, now U.S. Pat. No. 5,534,056.

FIELD OF THE INVENTION

This invention deals with a gas-impermeable, chemically inert container product and the method and apparatus for producing that product.

BACKGROUND OF THE INVENTION

Containers such as bottles, tanks, pouches and the like which serve for the storage of various materials such as juices, chemicals, food stuffs, other organic materials including blood, petroleum products and the like are affected by the physical and chemical properties at the interface of the container and its contents. Thus, the contents can be affected by chemical reactions which take place between the container material and the contents or by electrochemical effects caused by different ionic potentials at the interface or by transmission of damaging radiation of short wavelength light and UV through the container walls into the contents or by the gradual long-term permeation of external material such as gases or moisture through the container walls into the interior of the container. Also, permeation of materials from inside the container, e.g., gasoline vapors, may be harmful to the environment.

The three most damaging forces which impact the stability of the container contents, and thereby affect its commercial acceptability, are: 1) ultra-violet radiation reaching the contents through the container walls; 2) the gradual permeation of oxygen through the container walls into the contents and 3) the penetration of moisture through the container walls into the contents, and penetration of toxic materials inside the container into the external environment.

The classical solution to the above three problems is to make the container of thick glass or of metal or of multilayer laminates which typically contain metal foil to maintain aseptic conditions within the container and to protect the container contents. These approaches have been effective in the past. However, they also pose substantial burdens in terms of container cost, non-recycleability of the container and/or limited disposability of the container clue to container bulk. Also, some applications call for optically transparent containers.

The container material of choice these days is usually a plastic material or fiberglass a hyphen reinforced epoxy, both of which can be molded to produce a container having the desired shape. Using such materials, even odd-shaped containers such as gasoline tanks can be fabricated to fit into the contorted narrow spaces of an automotive chassis.

Unfortunately, however, certain container contents such as citrus juices, certain alcohols, benzene or the like will actually attack the container material and create conditions which lead to dangerous leakage and even to eventual corrosion and collapse of the container walls.

Accordingly, it would be desirable to be able to provide a container which can fit odd geometric spaces, be lightweight and rigid or flexible as desired and yet be capable of preventing damaging interactions of the container contents with the container material or external agents.

SUMMARY OF THE INVENTION

Accordingly, it is an object of the present invention to provide a new protective Container whose fabrication has not been possible heretofore due to the inability to treat the container surfaces so as to render them gas-impermeable and chemically inert.

Another object of the invention is to provide a container product which offers unusual protective barrier properties at the interface between the container and the container contents.

A further object of the invention is to provide a container of a material which blocks liquids and gases and which may also have blocking properties for selected wavelengths of light.

Another object of the invention is to provide a container having the above properties which can be shaped as desired.

Still another object of the invention is to provide a method of producing a container possessing one or more of the above properties.

A further object of the invention is to provide apparatus for making a container and a container wall structure having one or more of the above advantages.

Other objects will, in part, be obvious and will, in part, appear hereinafter.

The invention accordingly comprises the several steps and the relation of one or more of said steps with respect to each of the others, and the apparatus embodying the features of construction, combination of elements and arrangement of parts which are adapted to effect such steps, and the construction which possesses the characteristics, properties and relation of elements, all is exemplified in the detailed disclosure set forth hereinafter, and the scope of the invention will be indicated in the claims.

Briefly, our container is formed of a polymeric material which can be shaped as desired and whose inside surface is coated entirely with one or more thin layers of a barrier material deposited either before or after the container is made. In other words, in one embodiment of the invention, the barrier properties are imparted to the interior and/or exterior surface of an already formed container; in another embodiment, the barrier properties are applied to the surface (s) of a container material after which that material is formed into a container. By "container", we mean to include a bottle, tank, pouch, vial, capsule or other such enclosure having rigid or flexible walls.

With such constructions, two important goals of the invention are achieved, namely: the container contents only contact what appears to be solid, inert walls which prevents a chemical reaction between the container contents and the container walls or the transgression of the container contents through the container walls to the outside; at the same time deleterious external agents such as oxygen and moisture are prevented from permeating through the walls of the container and reaching the container contents.

In accordance with the invention, the inside surface of the container may be exposed to intense ion bombardment to clean the surface prior to application of the barrier coating. Then, the chemically inert barrier layer is applied to that surface. Due to the thinness, coherence and firm adhesion of the barrier layer to the base material, the mechanical characteristics of the overall container structure do not change.

In other words, if the uncoated container walls are flexible, they remain flexible after the barrier layer is applied; if the walls are rigid, they have essentially the same rigidity after being coated. Yet, the addition of the barrier layer effectively prevents the permeation of gases and moisture through the container walls in either direction and eliminates the danger of chemical reaction between the container and its contents.

With the ability to place an impermeable layer of inert material on the inside and/or outside of a container, an additional requirement will often arise namely, that the container be transparent in specific wavelength regions and yet block other wavelength radiation to prevent that other radiation from reaching the container contents. For example, in food packaging, it is desirable to prevent ultraviolet light from penetrating through the packaging and reaching the contents of the package while still allowing the customer to see what is in the package.

To achieve this end, the present container may incorporate an optical filter in the container walls through the addition in the container base material of tiny band gap particles, the bandgap of which will act as a filter cutting off all light with energies exceeding this bandgap or optical resonator particles as described in the above identified co-pending application, the contents of which is hereby incorporated by reference herein. This type of multi-functional container product is expected to play an important role in the marketing of environmentally friendly, recyclable packaging for foods, medicines and other substances.

In certain applications, a thin layer on the surface of the container can act as a radiation filter and this surface layer can even fulfill the dual role of an impervious layer to liquids and gases as well as have desirable characteristics as a radiation filter. Silicon films made of polycrystalline or amorphous phases in the proper thickness can provide a cutoff effect wherein all wavelengths shorter than the cutoff wavelength will be absorbed. Also, materials such as $Ga_xIn_{1-x}N$ or $Al_xIn_{1-x}N$ can be used. The mole fraction x determines the bandgap of the material and, the cutoff wavelength i.e., the wavelength at which light is blocked.

The present invention relies on four mechanisms, which may be used in combination with one another, to produce an optical filter with sharp transitions between absorbed and unabsorbed spectral wavelength regions. These mechanisms are as follows:

1. Absorption-edge materials absorb radiation having wavelengths shorter than a characteristic minimum, which corresponds energetically to the magnitude of the material's electronic bandgap. Particle size has no significant effect on this property, although a narrow size distribution and an upper limit on average size may prove critical to ensure that the particles do not scatter radiation in the spectral region that is to remain transmissive. Useful bandgap materials include (but are not limited to) direct semiconductors, as described more fully below.

The bandgap necessarily varies with the choice of material, but can, in some instances, be shifted across a portion of the spectrum by varying the constituents of an alloy comprising a mix of bandgap materials. In particular, there exist many alloys of semiconductors, e.g., InN and GaN, whose compositions can be varied continuously. Alloys of InN and GaN, can be prepared over the full range of molar fractions for each constituent. Alloys of InN and GaN can be prepared over the full range of molar fractions for each constituent. A desired bandgap between that exhibited by pure InN or pure GaN can be obtained by combining the materials in selected proportions; relationships between bandgap and constituent mole fraction, are generally smooth and can be straightforwardly determined by those skilled in the art without undue experimentation. Other useful alloy systems include those based on GaAs and AlAs.

2. Optical-resonance materials feature moderate intrinsic absorption, which would produce negligible overall absorption at the particle concentrations employed in the present invention. However, the optical-resonance phenomenon, based on self-reinforcing internal reflections, results in "absorption cross-sections" greater than unity in certain spectral regions; in other words, more radiation can be absorbed by the particle than actually falls geometrically on its maximum cross-sectional area. This is due to the wave nature of electromagnetic radiation and the propensity of the particle to "trap" certain frequencies of radiation, causing the radiation to travel back and forth within the particle until it is finally absorbed. The magnitude of the optical-resonance effect depends on the wavelength of incident radiation, the particle size, and the values of the real and imaginary components of the refractive index; particles that are large compared with the wavelength of incident radiation exhibit so many closely spaced (in terms of wavelength) resonances as to render selective absorption or scattering nearly impossible to control and use.

Optical resonance is enhanced by a high refractive index due to the resulting strong internal reflections, and also by a moderate intrinsic absorption level. Excessive absorption diminishes the resonance effect by immediately dissipating radiation as it enters the particle, while insufficient absorption caused incident radiation merely to undergo many reflections inside the particle; the radiation eventually leaves the particle without significant attenuation. Useful optical-resonance materials include (but are not limited to) "indirect" semiconductors, which exhibit gradual absorption edges, and whose overall absorption levels become significant only in resonant spectral regions.

In particular, preferred optical-resonance materials have refractive indices whose real components (N, as defined below) exceed 2; more preferably the index exceeds 3, and indices of 4 or 5 are even more advantageous. Preferred materials also exhibit only moderate absorption in the spectral region of interest. By "moderate absorption" we mean imaginary refractive-index components (K, as defined below) that range approximately from 0.02 to 0.5.

The following semiconductors are useful resonance absorbers.

| Chemical Formula | name | $\lambda_{bandgap}$ (µm) |
| --- | --- | --- |
| AlP | Aluminum Phosphide | 0.506 |
| $Al_xIn_{(1-x)}P$ | Aluminum Indium Phosphide | 0.506–0.918 |
| AlAs | Aluminum Arsenide | 0.579 |
| AlSb | Aluminum Antimonide | 0.765 |
| $GaAs_xP_{(1-x)}$ | Gallium Arsenide Phosphide | 0.548–0.817 |
| GaSb | Gallium Antimonide | 1.77 |
| CdSe | Cadmium Selenide | 0.712 |
| CdTe | Cadmium Telluride | 0.861 |
| ZnTe | Zinc Telluride | 0.551 |
| Si | Silicon | 1.12 |
| Ge | Germanium | 1.907 |
| — | Alloys of Silicon and Germanium | 1.12–1.907 | where $\lambda_{bandgap}$ represents the ceiling absorption wavelength below which the material is suitable.

An effective absorption cross-section larger than the particles' true geometric cross-section results in the need for a proportionately smaller concentration of particles to produce a desired level of absorption, assuming even particle distribution. Using, as an example, rutile or $TiO_2$ particles of average diameter 0.075 µm and absorption cross-section of 1.5, a typical working particle concentration (by volume) to produce 86.5% absorption is generally about 0.003%. Twice that concentration, or 0.006%, yields an absorption of 98.2%.

Small particles of bandgap materials will frequently exhibit resonance peaks as well as an absorption cutoff. Such resonance effects can greatly enhance the already-strong absorption at characteristic wavelengths near the energy bandgap of the absorption edge. Any selective absorption within the visible spectrum will create powerful, very pure colors.

3. Scattering The milky appearance found in translucent substances is due to scattering of visible light. This sometimes-undesirable effect occurs as a result of material inhomogeneities, the presence of large particles, agglomerations of small particles highly concentrated in a carrier material, and/or mismatch between the refractive index of highly concentrated particles and that of the carrier material.

The present invention exploits, for certain applications, the particle size- and wavelength-dependent scattering properties (with regard to incident radiation) of select particulate materials to achieve scattering of certain shorter wavelengths without scattering longer-wavelength radiation, thereby permitting its unobstructed transmission and avoiding, for example, a milky appearance.

4. Refraction Index Mismatch. Coating an inorganic optically resonant core particle of suitable dielectric constant with an inorganic radiation-absorptive material can, at matching wavelengths, transform the core particle into a composite structure whose color intensity exceeds that of the dye alone. This effect arises through excitation of the dye by the evanescent wave that runs around the resonant particle outside its physical dimension. To maximize the absorption cross-section and, therefore, the intensity of the evanescent wave, the refractive indices of the particle and that of the surrounding shell are deliberately mismatched, resulting in substantial trapping of incident light within the core particle and delivery of energy to the surrounding shell through the evanescent wave.

The selection of particles suited for achieving particular optical properties such as transmissivity or color is aided by Mie theory of light scattering, which can be used to establish, for a given type and size of particle, the degree to which a particle scatters and/or absorbs radiation of particular wavelengths. The ability to prevent transmission in certain wavelength bands—that is, the particle's net resistance to transmission of target radiation—is called "extinction," and results both from absorption and scattering of such radiation. Extinction can be controlled through the choice of particle material, its size and shape, and-the characteristics of the surrounding medium.

For an x-polarized electromagnetic wave incident in the z-direction on a spherical particle, the scattered amplitudes (in the limit of large distances from the sphere) can be represented as:

$$E_{s\theta}=E_0(-e^{ikr}/ikr)\cos\phi S_2(\cos\theta)$$

$$E_{s\phi}=E_0(-e^{ikr}/ikr)\sin\phi S_1(\cos\theta)$$

In the above equations, $E_{s\theta}$ and $E_{s\phi}$ are the amplitudes of the scattered E fields polarized in the $\theta$ or $\phi$ directions in a conventional spherical coordinate system. These two E field directions refer also to polarizations "in" and "perpendicular" to the plane of scattering. $E_0$ is the amplitude of the incident E field; k is the propagation vector in the surrounding medium with value $2\pi/\lambda$, where $\lambda$ is the wavelength of the radiation in the medium; and $S_1$ and $S_2$ are the scattering functions given by:

$$S_1 = \sum_n \frac{2n+1}{n(n+1)} (a_n\pi_n + b_n\tau_n)$$

$$S_2 = \sum_n \frac{2n+1}{n(n+1)} (a_n\tau_n + b_n\pi_n)$$

in which n is a summation index that is carried high enough to obtain convergence of the series (300 generally being sufficiently high for practical purposes). $\pi_n$ and $\tau_n$ are angle-dependent functions closely related to spherical harmonics, and are as follows:

$$\pi_n = \frac{P_n^1(\cos\theta)}{\sin\theta}$$

$$\tau_n = \frac{dP_n^1(\cos\theta)}{d\theta}$$

where $P_n^1(\cos\theta)$ represents spherical harmonic of order n. The functions $a_n$ and $b_n$ are as follows:

$$a_n = \frac{m\psi_n(mx)\psi'_n(x) - \psi_n(x)\psi'_n(mx)}{m\psi_n(mx)\xi'_n(x) - \xi_n(x)\psi'_n(mx)}$$

$$b_n = \frac{\psi_n(mx)\psi'_n(x) - m\psi_n(x)\psi'_n(mx)}{\psi_n(mx)\xi'_n(x) - m\xi_n(x)\psi'_n(mx)}$$

where $x=ka=2\pi N_{med}a/\lambda$, where $N_{med}$ is the refractive index of the surrounding medium, a is the radius of the particle sphere, $\lambda$ is the vacuum wavelength of the incident radiation, and $m=N_1/N_{med}$, where $N_1$ is the usually complex index of refraction of the scattering sphere. The complex and real Components of $N_1$ are typically represented as $N_1=N+iK$, where K is proportional to the absorption coefficient. Plots of N and K as a function of wavelength for rutile crystals appear in FIG. 2. The functions $\psi$ and $\xi$ are defined as:

$$\psi_n(\rho)=(\pi\rho/2)^{1/2}J_{n+\frac{1}{2}}(\rho)$$

$$\xi_n(\rho)=(\pi\rho/2)^{1/2}(J_{n+\frac{1}{2}}(\rho)+iY_{n+\frac{1}{2}}(\rho))$$

where J and Y refer to the half-integer Bessel and Neumann functions.

The foregoing equations can be used to calculate the degree of scattering and absorption for a given particle. The total scattering cross-section of a particle is derived by integration of the scattered light over the solid angle $4\pi$. The extinction cross-section, which represents the sum of absorption and scattering, can be similarly calculated; for the unpolarized light found in ordinary environments, one averages over all polarizations to derive values for scattering and extinction cross-sections as follows:

$$C_{sca} = \frac{2\pi}{k^2} \sum_n (2n+1)(|a_n|^2 + |b_n|^2),$$

$$C_{ext} = \frac{2\pi}{k^2} \sum_n (2n+1)Re(a_n + b_n)$$

The absorption cross-section, $C_{abs}$, is the difference between the extinction and scattering cross-sections.

The following computer program, written in FORTRAN and based on the foregoing equations, may be used to calculate scattering and extinction cross-sections, the scattering matrix elements and the angular dependence of the scattered light as a function of sphere radius, the complex index of refraction $N_1$, the refractive index of the surrounding medium, and the wavelength of incident radiation.

```
 1      PROGRAM MIE
 2 C
 3 C------------------------------------------------------------
 4 C
 5 C
 6 C
 7 C
 8 C
 9 C
10 C
11 C
12 C------------------------------------------------------------
13      IMPLICIT REAL*8 (A-H,O-Z)
14      COMPLEX*16 REFREL,S1(200),S2(200)
15      WRITE (5,11)
16 C------------------------------------------------------------
17 C INSERT HERE REFMED (REAL INDEX OF THE SURROUNDING MEDIUM)
18 C------------------------------------------------------------
19      REFMED=1.0D0
20 C------------------------------------------------------------
21 C REFRACTIVE INDEX OF SPHERE= REFRE+I*REFIM
22 C------------------------------------------------------------
23      REFRE=1.55D0
24      REFIM=0.D0
25      REFREL=DCMPLX(REFRE,REFIM)/REFMED
26      WRITE(5,12) REFMED,REFRE,REFIM
27 C------------------------------------------------------------
28 C SPHERE RADIUS AND WAVELENGTH OF LIGHT IN SAME UNITS ( MICRONS)
29 C------------------------------------------------------------
30      RAD=.525D0
31      WAVEL=.6328D0
32      X=2.*3.141592654*RAD*REFMED/WAVEL
33      WRITE(5,13) RAD,WAVEL
34      WRITE(5,14) X
35 C------------------------------------------------------------
36 C NANG=NUMBER OF ANGLES BETWEEN 0 AND 90 DEGREES AT WHICH SCATTERING
37 C MATRIX ELEMENTS WILL BE CALCULATED
38 C------------------------------------------------------------
39      NANG=11
40      DANG=1.570796327/DFLOAT(NANG-1.)
41      CALL BHMIE(X,REFREL,NANG,S1,S2,QEXT,QSCA,QBACK)
42      WRITE(5,65) QSCA,QEXT,QBACK
43      WRITE(5,17)
44 C------------------------------------------------------------
45 C S11 NORMALIZED TO ONE IN FORWARD DIRECTION. S33 AND S34 NORMALIZED
46 C BY S11. POL= DEGREE OF POLARIZED LIGHT WHEN INCIDENT UNPOLARIZED
47 C------------------------------------------------------------
48      S11NOR=.5*(CDABS(S2(1))**2+CDABS(S1(1))**2)
49      NAN=2*NANG-1
50      DO 355 J=1,NAN
51      AJ=J
52      S11=0.5*CDABS(S2(J))*CDABS(S2(J))
53      S11=S11+.5*CDABS(S1(J))*CDABS(S1(J))
54      S12=.5*CDABS(S2(J))*CDABS(S2(J))
55      S12=S12-.5*CDABS(S1(J))*CDABS(S1(J))
56      POL=-S12/S11
57      S33=DREAL(S2(J)*DCONJG(S1(J)))
58      S33=S33/S11
59      S34=DIMAG(S2(J)*DCONJG(S1(J)))
60      S34=S34/S11
61      S11=S11/S11NOR
62      ANG=DANG*(AJ-1.)*57.29577951
63  355 WRITE(5,75) ANG,S11,POL,S33,S34
64   65 FORMAT (//,1X,'QSCA= ',E13.6,3X,'QEXT= ',E13.6,3X,
65      &'QBACK= ',E13.6)
66   75 FORMAT(1X,F6.2,2X,E13.6,2X,E13.6,2X,E13.6,2X,E13.6)
67   11 FORMAT (/'SPHERE SCATTERING PROGRAM'//)
68   12 FORMAT (5X,'REFMED= ',F8.4,3X,'REFRE= ',E14.6,3X,
69      &'REFIM= ',E14.6)
70   13 FORMAT(5X,'SPHERE RADIUS= 'F7.3,3X,'WAVELENGTH='F7.4)
71   14 FORMAT(5X, 'SIZE PARAMETER= ',F8.3/)
72   17 FORMAT(//,2X,'ANGLE',7X,'S11',13X,'POL',13X,'S33',13X,'S34'//)
73      STOP
74      END
```

```
75  C------------------------------------------------------------
76  C  SUBROUTINE CALCULATES SCATTERING MATRIX ELEMENTS, SCATTERING AND
77  C  EXTINCTION CROSS-SECTIONS
78  C------------------------------------------------------------
79         SUBROUTINE BHMIE(X,REFREL,NANG,S1,S2,QEXT,QSCA,QBACK)
80         IMPLICIT REAL*8 (A-H,O-Z)
67      11 FORMAT (//'HERE SATTERING PROGRAM'//)
68      12 FORMAT (5X, 'REFFMED= ',F8.4,3X,'REFRE= 'E14.6,3X,
69        &'REFIM= ',E14.6)
70      13 FORMAT(5X,'SPHERE RADIUS=',F7.3,3X,'WAVELENGTH= 'F7.4)
71      14 FORMAT(5X, 'SIZE PARAMETER= ',F8.3/)
72      17 FORMAT(//,2X,'ANGLE',7X,'S11',13X,'POL',13X,'S33',13X,'S34',//)
73         STOP
74         END
75  C------------------------------------------------------------
76  C  SUBROUTINE CALCULATES SCATTERING MATRIX ELEMENTS, SCATTERING AND
77  C  EXTINCTION CROSS-SECTIONS
78  C------------------------------------------------------------
79         SUBROUTINE BHMIE(X,REFREL,NANG,S1,S2,QEXT,QSCA,QBACK)
80         IMPLICIT REAL*8 (A-H,O-Z)
81         DIMENSION AMU(100),THETA(100),PI(100),TAU(100),PI0(100),PI1(100)
82         COMPLEX*16 D(3000),Y,REFREL,XI,XI0,XI1,AN,BN,S1(200),S2(200)
83         DX=X
84         Y=X*REFREL
85  C------------------------------------------------------------
86  C  SERIES TERMINATED AFTER NSTOP TERMS
87  C------------------------------------------------------------
88         XSTOP=X+4.*X**.3333+2.
89         NSTOP=XSTOP
90         YMOD=CDABS(Y)
91         NMX=DMAX1(XSTOP,YMOD) + 15
92         DANG=1.570796327/DFLOAT(NANG-1)
93         DO 525 J=1,NANG
94         THETA(J)=(DFLOAT(J)-1.)*DANG
95     555 AMU(J)=DCOS(THETA(J))
96  C------------------------------------------------------------
97  C  LOGARITHMIC DERIVATIVE D(J) CALCULATED BY DOWNWARD RECURRENCE
98  C  BEGINNING WITH INITIAL VALUE 0.0+ 1.0*I AT J=NMX
99  C------------------------------------------------------------
100        D(NMX)=DCMPLX(0.D0,0.D0)
101        NN=NMX-1
102        DO 120 N=1,NN
103        RN=NMX-N+1
104    120 D (NMX-N)=(RN/Y)-(1./(D(NMX-N+1)+RN/Y))
105        DO 666 J=1,NANG
106        PI0(J)=0.D0
107    666 PI1(J)=1.D0
108        NN=2*NANG-1
109        DO 777 J=1,NN
100        S1(J)=DCMPLX(0.D0,0.D0)
111    777 S2(J)=DCMPLX(0.D0,0.D0)
112 C------------------------------------------------------------
113 C  RICCATI BESSEL FUNCTIONS WITH REAL ARGUMENT 8 CALCULATED
114 C  BY UPWARD RECURRENCE
115 C------------------------------------------------------------
116        PSI0=DCOS(DX)
117        PSI1=DSIN(X)
118        CHI0=-DSIN(X)
119        CHI1=DCOS(DX)
120        APSI0=PSI0
121        APSI1=PSI1
122        XI0=DCMPLX(APSI0,-CHI0)
123        XI1=DCMPLX(APSI1,-CHI1)
124        QSCA=0.D0
125        N=1
126    200 DN=N
127        RN=N
128        FN=(2.*RN+1.)/(RN*(RN+1.))
129        PSI=(2.*DN-1.)*PSI1/DX-PSI0
130        APSI=PSI
132        CHI=(2.*RN-1.)*CHI1/X-CHI0
132        XI=DCMPLX(APSI,-CHI)
133        AN=(D(N)/REFREL+RN/X)*APSI-APSI1
134        AN=AN/((D(N)/REFREL-RN/X)*XI-XI1)
135        BN=(REFREL*D(N)+RN/X)*APSI-APSI1
136        BN=BN/((REFREL*D(N)+RN/X)*XI-XI1)
137        QSCA=QSCA+(2.*RN+1.)*(CDABS(AN)*CDABS(AN)+CDABS(BN)*CDABS(BN))
138        DO 789 J=1,NANG
139        JJ=2.*NANG-J
140        PI(J)=PI1(J)
```

```
                            -continued

141         TAU(J)=RN*AMU(J)*PI(J)-(RN+1.)*PI0(J)
142         P=(-1)**(N-1)
143         S1(J)=S1(J)+FN*(AN*PI(J)+BN*TAU(J))
144         T=(-1)**N
145         S2(J)=S2(J)+FN*(AN*TAU(J)+BN*PI(J))
146         IF(J.EQ.JJ) GOTO 789
147         S1(JJ)=S1(JJ)+FN*(AN*PI(J)*P+BN*TAU(J)*T)
148         S2(JJ)=S2(JJ)+FN*(AN*TAU(J)*T+BN*PI(J)*P)
149    789  CONTINUE
150         PSI0=PSI1
151         PSI1=PSI
152         APSI1=PSI1
153         CHI0=CHI1
154         CHI1=CHI
155         XI1=DCMPLX(APSI1,-CHI1)
156         N=N+1
157         RN=N
158         DO 999 J=1,NANG
159         PI1(J)=((2.*RN-1.)/(RN-1.))*AMU(J)*PI(J)
160         PI1(J)=PI1(J)-RN*PI0(J)/(RN-1.)
161    999  PI0(J)=PI(J)
162         IF(N-1-NSTOP) 200,300,300
163    300  QSCA=(2./(X*X))*QSCA
164         QEXT=(4./(X*X))*DREAL(S1(1))
165         QBACK=(4./(X*X))*CDABS(S1(2*NANG-1)*CDABS(S1(2*NANG-1))
166         RETURN
167         END
```

As will be described in more detail later, our method of fabricating the protective container walls utilizes the microwave or rf frequency transmission capability of the container base material for high frequency electromagnetic radiation to transfer intense energy into the inside of the container. During the fabrication process, one or more containers are placed inside a vacuum chamber which also functions as a resonant cavity. The chamber, including the containers, is filled with an inert gas such as argon. Then, microwave or Rf energy of such a frequency to generate a resonance in the chamber is applied to the chamber and its contents so as to fill the entire space with multi-mode resonating energy. The chamber acts as a cavity for the resonance. This produces a plasma in the chamber both inside and outside the containers. The plasma, consisting of electrons and ionized gas, produces an intense ionic bombardment of the walls of the containers which removes adsorbed gases, particulate material and any condensed moisture from those walls.

To meet the extreme impermeability requirements for the containers, prior to application of electromagnetic energy to the containers, a preparatory surface sealing step may be carried out by injecting a certain plasticizer (which will crosslink with ion and electron bombardment) as a vapor into the containers so that the vapor becomes deposited on the container walls and covers those surfaces with a coherent skin. Once coated thusly, the subsequent ion bombardment will crosslink the polymer skin throughout creating a continuous, chemically pristine undersurface for the barrier layer(s). In some applications, a highly crosslinked underlayer may, in itself, prevent the seepage of gases or liquids into the container walls.

Following the aforesaid surface preparation, a new type of plasma is ignited in the containers now filled with specified reactant gases. Gas vapor reacts chemically because of the plasma excitation and the reaction product becomes deposited on the preconditioned container walls and firmly adheres thereto forming a continuous barrier layer. As will be described in more detail later, the reactant gases and the energy are applied to the containers using a special pulsed mode gas and energy insertion technique which maintains precise control over the temperature and the stoichiometry (where applicable) of the reactant gases so as to produce a high quality barrier layer of the requisite thickness.

Using our process, the internal surfaces of certain containers such as fuel tanks can be covered by a multi-layer compendium of coatings having a relatively large total thickness, but whose internal stresses and strains are minimized through the use of intermediate stress-relieving interface layers. In this manner, containers can be equipped with an internal barrier layer whose chemical resistance to alcohol, acid, solvents and the like is optimal, but which derives its hardness from a special top or outer coating, while elasticity and shock absorptivity are furnished by a relatively thick under-layer that bonds well to the container walls.

As will be seen, containers can even be made having a multi-layer wall structure in which the barrier layer is located in the middle of the walls.

All of these container structures are vastly superior to present day containers because they weigh less and require less material, yet they are still readily disposable and recyclable. Additionally, if desired, the structures may be fully transparent in the visible portion of the spectrum so that it is possible to clearly see the container contents.

BRIEF DESCRIPTION OF THE DRAWINGS

For a fuller understanding of the nature and objects of the invention, reference should be had to the following detailed description taken in connection with the accompanying drawings, in which.

DESCRIPTION OF THE PREFERRED EMBODIMENTS

Figure 1:
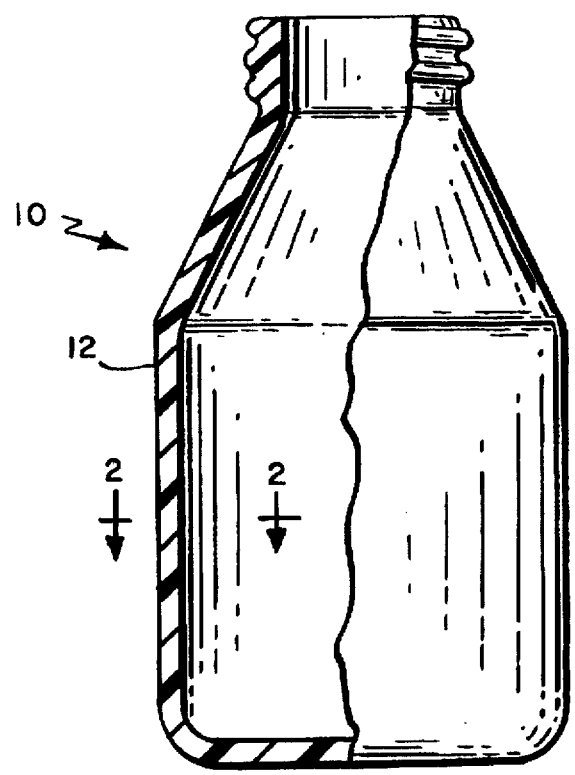
FIG. 1 is a sectional view of a container incorporating our invention.

FIG. 1 of the drawings shows a container 10 having a wall 12 of polymeric material. The container is illustrated as being a bottle or jar; however, it could just as well be an oddly shaped tank, bowl, vial or other article which provides access to the interior of the article.

Figures 2A, 2B, 2C:
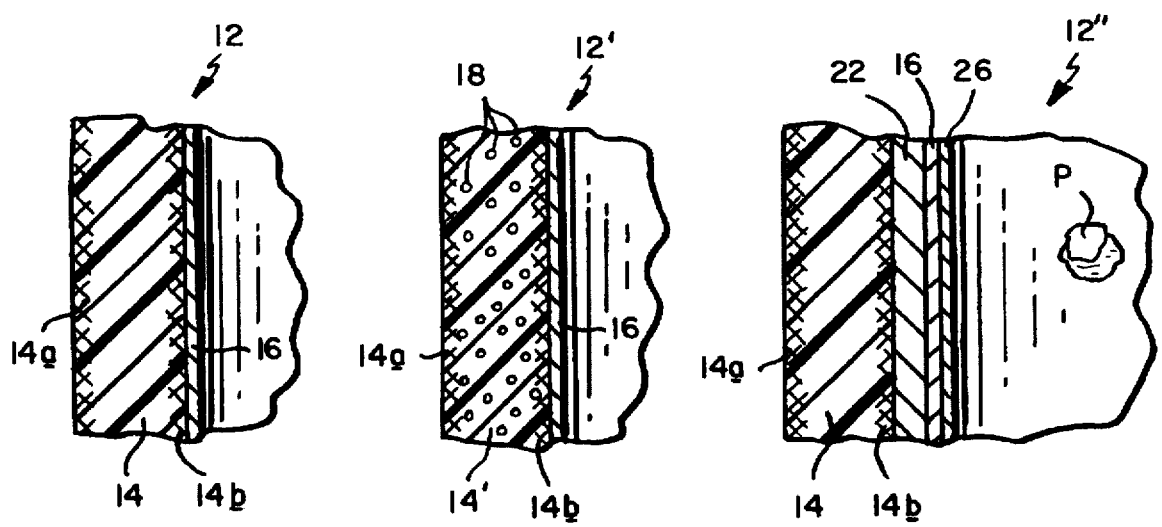
FIGS. 2A, 2B and 2C are fragmentary sectional views taken along line 2—2 of FIG. 1 showing different wall structures that may be present in the FIG. 1 container.

As shown in FIG. 2A, usually wall 12 comprises a transparent base layer 14 of a polymeric material such as polypropylene, but it may also be of an opaque material such as fiberglass- reinforced epoxy. Typically, layer 14 has a thickness in the order of 300 μm. The outer and inner surfaces 14a and 14b of base layer 14 may be subjected to a plasma to render those surfaces chemically pure as shown by the hatching. This enables the outer surface 14a to be printed on With a hot melt ink (not shown) and makes the inner surface 14b chemically receptive so that it provides an excellent bonding surface for a blocking layer 16 applied to layer 14b by vapor deposition in the presence of a plasma.

Depending upon the particular application, layer 16 may consist of any one of a variety of inorganic materials such as aluminum oxide ($Alt_2O_3$), silicon dioxide ($SiO_2$), boron nitride (BN), silicon nitride ($Sl_3N_4$) which are chemically inert and fluid impermeable with the exception of $SiO_2$ which is slightly water permeable. The barrier layer 16 for a container such as bottle 12 may have a thickness in the order of 100–1000 Å. The wall structure 12 is suitable for a container intended to hold solvents, acids or other such fluids which would otherwise react chemically with the base layer 14 material. That wall structure would also be suitable for containers whose contents might be adversely affected by oxygen or moisture that would penetrate through the base layer 14 but for the barrier layer 16.

FIG. 2B illustrates another container wall structure 12' which is similar to wall 12 in that it is composed of a polymeric base layer 14' whose pretreated interior surface 14b is covered by a barrier layer 16 so that it has all of the attributes of the wall structure 12. In addition, however, the base layer 14' of wall 12' contains tiny, monodispersed, inorganic, radiation blocking particles 18 described in detail in the above-identified pending application, the contents of which is hereby incorporated by reference herein. For example, for modest mass loadings of silicon particles 18, the base layer 14' can be designed to provide good radiation blocking for short wavelengths, but good transmission for longer wavelengths. Therefore, the wall structure 12' in FIG. 2B will protect the contents of container 10 from external UV radiation, while allowing one to see the contents of the container through wall 12, assuming that the barrier layer 16 is of a material such as aluminum oxide which is transparent to visible light.

A container 10 having the wall structure 12' would be suitable for packaging foods, pharmaceuticals and the like which degrade upon being exposed to sunlight.

FIG. 2C illustrates another wall structure 12" for container 10 which comprises several layers that are applied to the pre-treated inner surface 14b of a base layer 14 similar to the one in FIG. 2A. The wall structure 12" includes a relatively thick, e.g., 1000 Å, underlayer 22 of a somewhat softer material that is compatible with the barrier layer 16.

For example, layer 22 may be silicon dioxide with some residual free radicals of $CH_2$ or $CH_3$ or siloxane, i.e., a transitional material or the like which provides stress relief for a barrier layer 16 and whose chemical resistance to alcohols, acids, solvents or the like is optimal, but which derives its hardness from a top or outermost layer 26 of an abrasion-resistant material such as silicon dioxide or aluminum oxide. The wall structure 12" would be suitable for containers requiring an abrasion-resistant interior surface for protection against mechanical attack from container contents such as particles P or from cleaning brushes and the like. It would also be suitable for fuel tanks which are exposed to vibration and shock forces during normal use.

Instead of, or in addition to, having the mechanical and radiation barrier functions in different layers of the container walls as described in connection with FIG. 2A, those functions may be incorporated into a surface layer applied to the base layer 14. This is accomplished by applying to the plain polymeric base layer films or layers consisting of the polycrystalline or amorphous phase of silicon in the proper thickness. Such films are impervious to liquids and gases. They also provide a cutoff effect so that all wavelengths of incident radiation shorter than the selected cutoff wavelength are absorbed by the surface films or layers, while wavelengths above the cutoff may pass through the container walls. Thus, for example, the cutoff wavelengths may be chosen to exclude UV light from the container interior while allowing one to see the container contents. Thus, those films behave in a manner similar to the small silicon particle-filled films or layers described in the above application.

Figure 3:
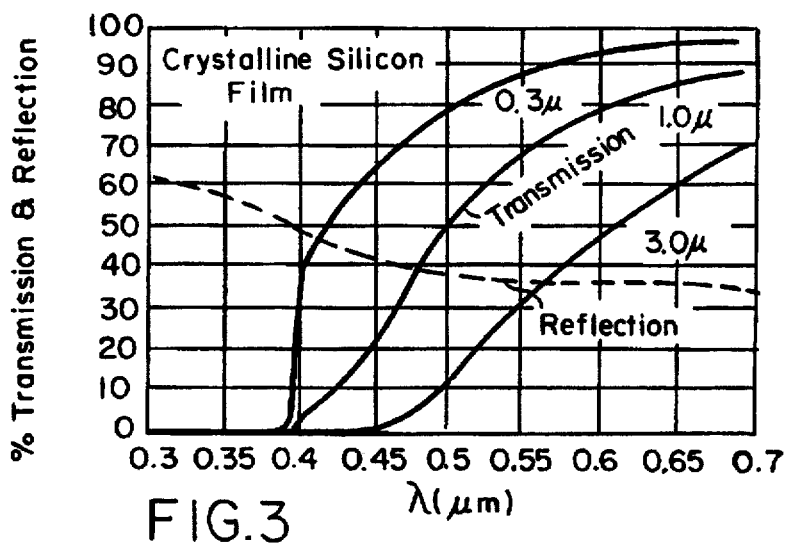
FIGS. 3, 4 and 5 are graphical diagrams showing the transmission and reflection properties of certain wall structures embodying the invention.
Figure 4:
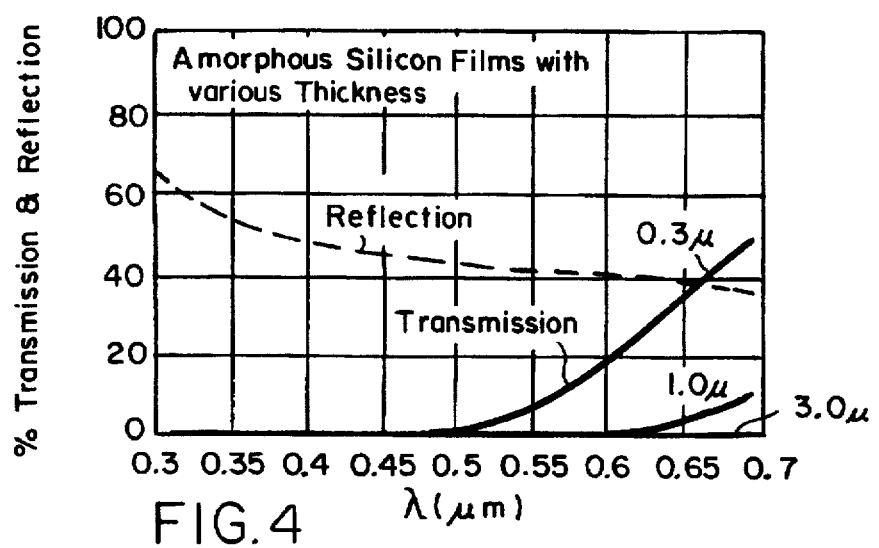
Figure 5:
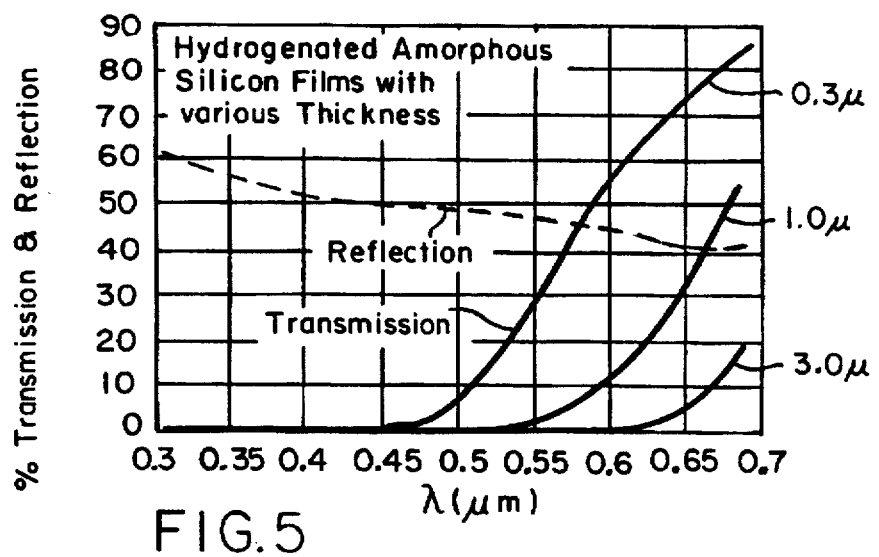

Refer now to FIGS. 3, 4 and 5 which illustrate the optical transmission and reflection properties of three different-thickness dual function barrier layers 16 such as depicted in FIG. 2. In FIG. 3, the layer 16 is a film of crystalline silicon, in FIG. 4, the layer 16 is of amorphous silicon and in FIG. 5, the layer 16 is of hydrogenated amorphous silicon. As seen from those figures, the different layers have very different radiation transmission characteristics that may suit different applications for the wall structure disclosed herein. For example, a layer 16 of crystalline silicon 1.0 μ thick (FIG. 3) has a cutoff wavelength about 0.4 μm, while an equally thick layer of amorphous silicon (FIG. 4) has a cutoff of about 0.6 μm.

Figure 6:
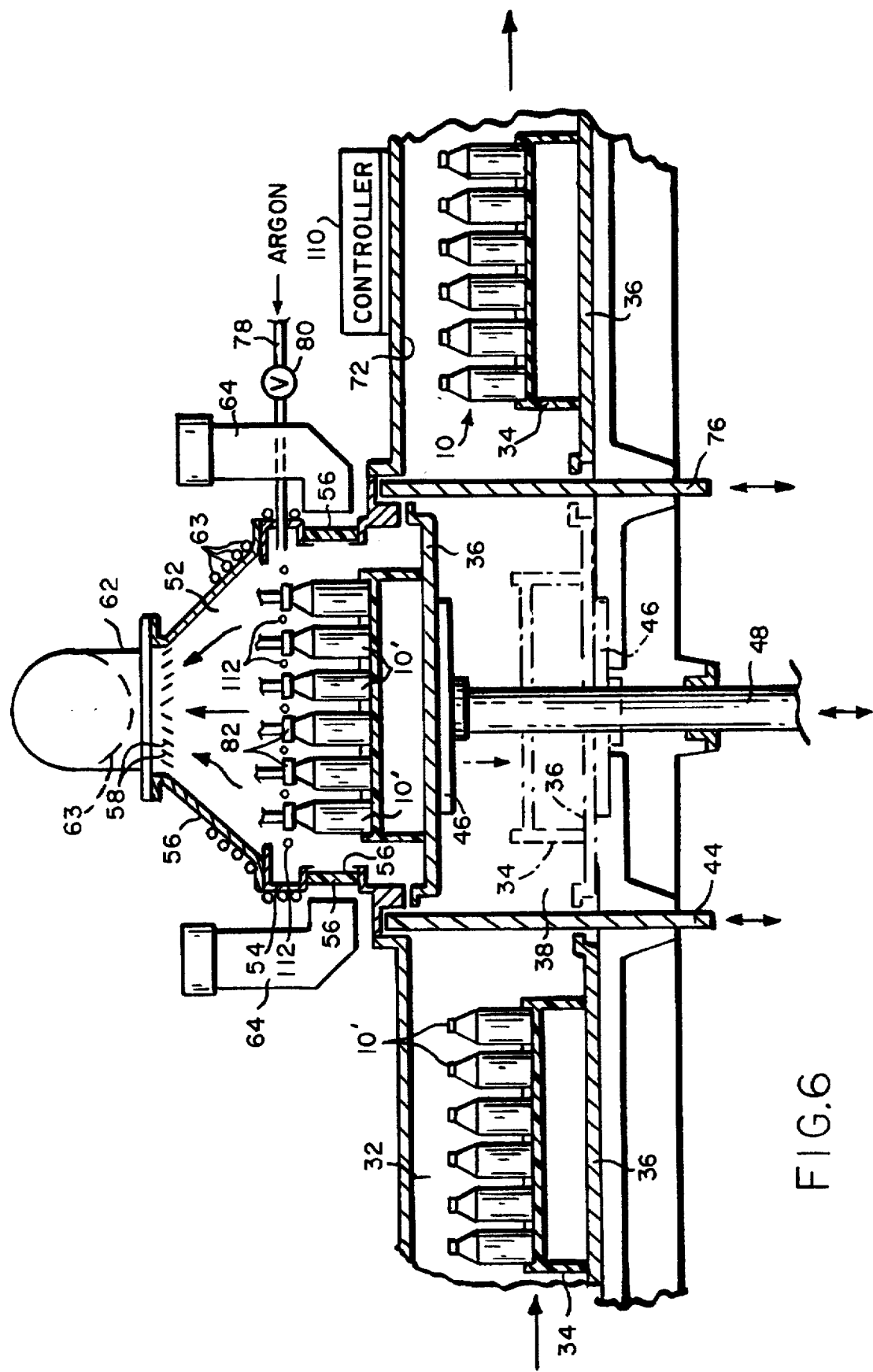
FIG. 6 is a longitudinal sectional view of apparatus for making the FIG. 1 container.

Refer now to FIG. 6 which illustrates apparatus for fabricating the wall structures illustrated in FIGS. 2A, 2B and 2C. The apparatus processes the containers 10 in batches. It includes an antechamber 32 into which a plurality of untreated containers 10' in a rack 34 may be transported on a tray 36. Chamber 32 communicates with a lock 38 by way of a vertically reciprocable gate 44 which may be opened and closed by conventional means (not shown).

The lock 38 contains an elevator 46 which may be moved up and down within that chamber by a piston rod 48 reciprocated by a standard double-acting pneumatic or hydraulic cylinder (not shown). When gate 44 is open, and the elevator 46 as in its lower position, a tray 36 carrying a batch of untreated containers 10' may be slid into the lock 38 as shown in phantom in FIG. 6. Then, the elevator 46 may be moved to its upper position in lock 38 shown in solid lines in FIG. 6. This lifts rack 34 and the containers therein to a coating chamber 52 above lock 38. When the elevator 46 is in its upper position, the tray 36 which it supports forms the lower wall of the coating chamber 52.

The coating chamber 52 also has side walls 54 and a top wall or hood 56 which communicates by way of a baffle 58 with an exhaust duct 62 leading to a vacuum source 63 such as turbomolecular pumps and/or Root pumps. Preferably, these walls are surrounded by or contain cooling conduits 63 through which cold water may be circulated to cool chamber 52.

A plurality of RF generators 64 are positioned adjacent to chamber 52. Energy from the generators is coupled into chamber 52 through ports 56 in the chamber side wall 54. Also, the chamber is dimensioned so that it constitutes a resonant cavity. Thus, the chamber functions as a microwave resonant heating cavity and consequently as a heating source, similar to a microwave oven, for heating the contents of the chamber. Typically, the RF generators 64 may operate at 900 MHZ with a power output in the order of 40 KW which fills the chamber 52 with various shifting intense modes of resonating energy.

Positioned on the opposite side of the lock 38 is an exit chamber 72 which communicates with chamber 38 by way of a vertically reciprocable gate 76 which may be moved between its open and closed positions by any suitable means (not shown). When the elevator 46 is in its lower position shown in phantom in FIG. 6 and the gate 76 is open, the tray 36 and the containers supported thereon may be moved from lock 38 to the exit chamber 72.

When both gates 44 and 76 are closed and elevator 46 is in its raised position, the vacuum source 63 draws a high vacuum, e.g., $10^{-3}$ Torr, in coating chamber 52; a lesser vacuum, e.g., $10^{-2}$ Torr, may exist in lock 38. Also, an inert gas such as argon may be introduced into chamber 52 through a pipe 78 leading into that chamber, the flow of gas through the pipe being controlled by a valve 80.

Figure 7:
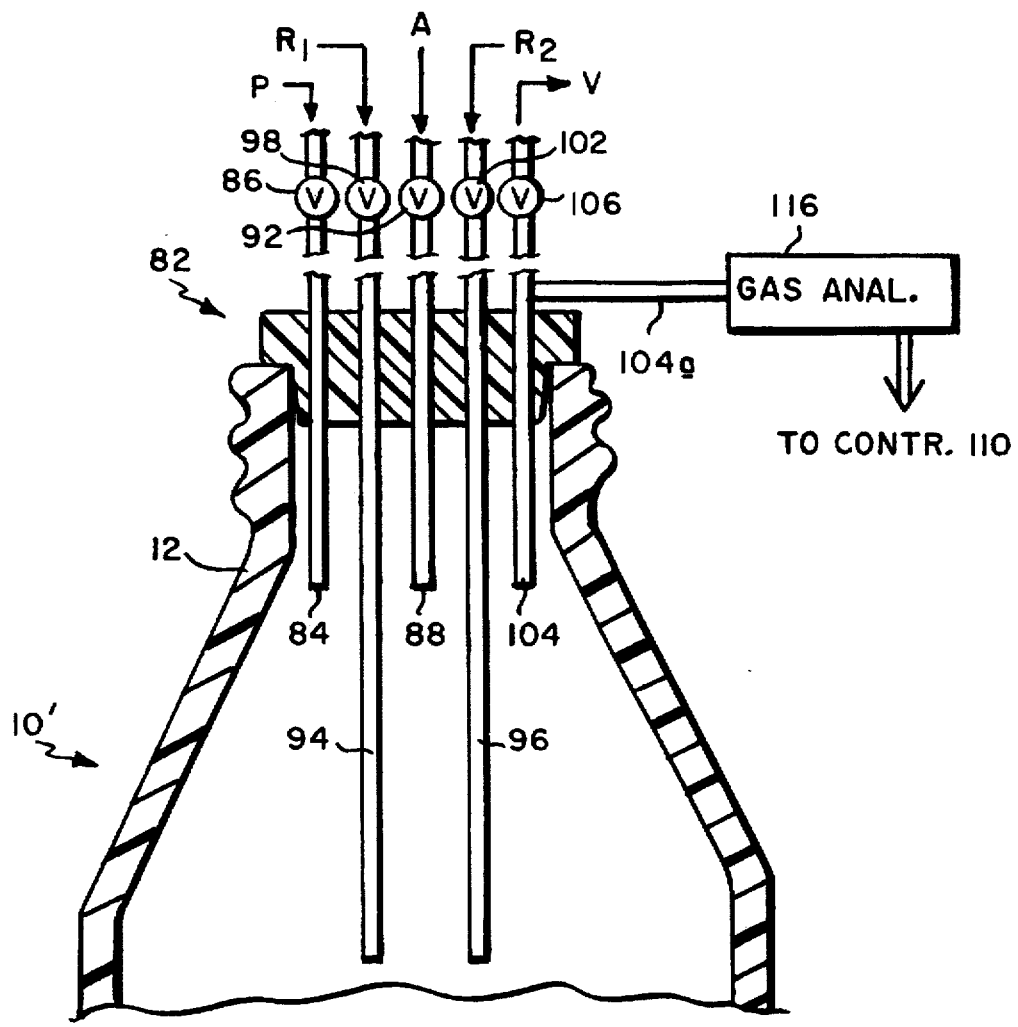
FIG. 7 is a vertical section on a larger scale showing a portion of the FIG. 6 apparatus in greater detail.

Referring now to FIGS. 6 and 7, when the elevator 46 is raised to position the array of untreated containers 10' in coating chamber 52, the open mouths of the containers are positioned opposite a corresponding array of heads 82 mounted inside the chamber. Each head 82 is shaped like a stopper so that it closes the mouth of the underlying container. Each head 82 is designed to introduce a plurality of gases into and draw gas from the corresponding container. For this, each head 82 is equipped with five tubes which extend down into the container whose mouth is closed by that head. There is a tube 84 which is connected by a solenoid valve 86 to a source of plasticizer P. A similar tube 88 is connected by a solenoid valve 92 to a source of inert gas such as argon A. A pair of longer tubes 94 and 96 are connected by valves 98 and 102, respectively, to sources of different reactive gases $R_1$ and $R_2$ to be described later. Finally, there is a tube 104 connected by a valve 106 to a vacuum source V which may be the duct 62 or a separate vacuum pump (not shown).

All of the valves 80, 86, 92, 98, 102 and 106 are controlled by a controller 110 shown in FIG. 6 which also controls the operation of the lock gates 44 and 76, piston 48 and the RF generators 64. Controller 110 also receives temperature information from temperature sensors 112 inside the coating chamber 52. In response to these signals, the controller regulates the power output of generators 64 so as to control within precise limits the temperature of the containers in chamber 52.

During operation of the FIG. 6 apparatus, with gate 44 in its open position and elevator 46 in its lower position, a batch of untreated containers 10' may be moved from antechamber 32 into the lock 38, gate 76 being closed. Controller 110 may then close gate 44 and raise the elevator to position the batch of containers inside coating chamber 52 so that the open mouths of those containers are closed by the array of heads 82 in that chamber. Next, controller 110 controls the vacuum source 63 and valve 106 so as to provide a low pressure, e.g., $2 \times 10^{-3}$ Torr, inside containers 10' as well as inside chamber 52 as a whole so that there is essentially no pressure differential across the container walls 12.

Next, valves 80 and 92 are opened so that an inert gas such as argon is flowed into chamber 52 and into the containers 10'. At this point, the controller 110 activates the RF generators 64. The containers 10' being of a dielectric material are essentially transparent to the electromagnetic radiation. Therefore, intense microwave energy produced in chamber 52 is transmitted to the interiors of the containers and ionizes the argon gas therein producing a plasma within the containers 10'. The gas in chamber 52 is also ionized producing a plasma around the containers. These plasmas result in intense ionic bombardment of the inside and outside walls of the containers which removes adsorbed gases, particulate matter such as dust and any condensed moisture from those walls. Resultantly, the wall surfaces become chemically pure and quite receptive to chemical vapor deposition coating, in the case of the inside surfaces, and to later printing with hot-melt ink, in the case of the outside surfaces. The surfaces may also acquire a surface treatment which aids the deposition or printing process.

To meet extreme impermeability requirements, it may also be desirable to seal the just-cleaned interior surfaces of the containers 10'. For this, controller 110 closes valve 80 so that the argon gas present in the chamber is removed via duct 62 and closes the exhaust valves 106. It then momentarily opens valves 86 to inject a plasticizer into the containers 10'. The plasticizer enters the containers as a vapor cloud raising the pressure therein somewhat and becomes deposited on the inner surfaces of the containers. Moreover, due to the pressure differential now present across the container walls 12, the plasticizer will be sucked into any pores or microvoids in the container walls. Next, the controller 110 activates the RF generators 64. The resulting microwave energy inside the containers crosslinks the polymer skin on the container interior walls thereby sealing those surfaces with a coherent skin.

Following the container 10' surface preparation steps just described, a new type of plasma is ignited inside the containers whose constituents are selected reactant gases. More particularly, after controller 110 opens exhaust valve 106 momentarily to remove any residual gases from containers 10', it opens valves 98 and 102 to allow measured amounts of the reactant gases $R_1$ and $R_2$ into the containers. For example, if the barrier layers 16 being applied to the container interior walls is silicon dioxide, the reactant gases $R_1$ and $R_2$ may be silane and oxygen. On the other hand, if the barrier layers are boron nitride, the reactant gases may be boron trichloride and ammonia.

To maintain precise stoichiometry of the reactant gases used in this step of the process, the gas content of the containers may be measured using an on-line gas analyzer 116 which monitors the gas contents of exhaust tubes 104 via branch lines 104a (FIG. 7) and which is linked to controller 110.

At this point, controller 110 turns on the RF generators 64 so that the gases $R_1$ and $R_2$ inside containers 10' respond reactively to the microwave energy and form a compound chemical vapor which, due to diffusion pressure, becomes deposited uniformly on the container interior walls to form the barrier layers 16 that results from the reaction of the two gases, e.g., silicon dioxide or boron nitride. Controller 110, responding to the outputs of the temperature sensors 112, monitors the temperature of the container walls 12 and regulates the power output of generators 64 to assure an amorphous build up, without micro-crystallization, of the barrier layers 16 on the container walls 12.

As a result of the chemical vapor condensation of the reacting gases on the container walls 12, those walls will heat up and could reach excessive temperatures. This could result in structural softening of the walls, outgassing and the formation of exudates such as plastisizer micro-spheroids, all of which would negatively affect the quality of the barrier layer 16 through poor adhesion of the barrier layers 16 to the base layers 14 and the formation of pin holes in the barrier layers. Thus, it is essential that the containers be maintained at a moderate, non-critical temperature, particularly if the container base layer 14 consists of an epoxy or a polymer. This is accomplished by applying the barrier layers 16 to the base layers 14 of containers 10' in a succession of deposition events rather than all at once.

More particularly, controller 110 controls the reactant gas valves 98 and 102 and the exhaust valve 106 so that the reactant gases are injected into the containers 10' at high frequency intervals. That is, during each injection, the stoichiometry of the gases in the containers is maintained at exact proportions. On the other hand, during the pulse interval time, the residual gas left from the previous injection pulse and not yet deposited on the container walls is pumped out of the containers to maintain the purity and stoichiometric balance of the internal environment in the containers.

In addition, while pulsing the gas injection, controller 110 also pulses the RF generators 64 in synchronism so that microwave energy is also pulsed into the coating chamber 52. This allows the container walls to maintain thermal equilibrium by dissipating, during the power pulse intervals, the deposition heat by radiation and convection to the water-cooled walls of chamber 52.

Figure 8:
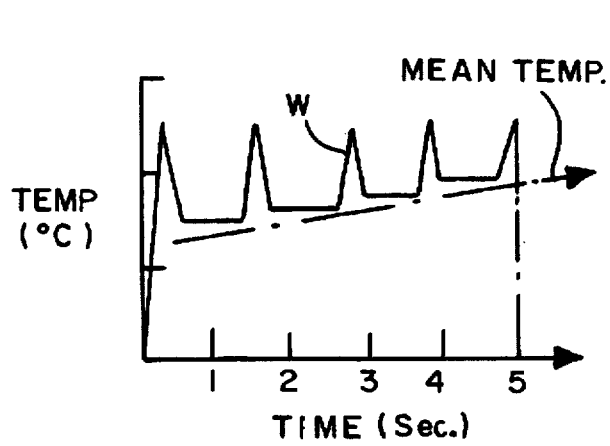
FIG. 8 shows the wall temperature of a FIG. 1 container during the operation of the FIG. 6 apparatus.

Thus, referring to FIG. 8, while the temperature of the container walls 12 may become quite high momentarily as shown by the waveform W, the mean temperature of the walls, while increasing during the coating process, remains below the softening temperature of the wall 12 material, below e.g., 50° C. In a typical example, the coating time needed for growing sufficient and effective barrier coatings 16 on the container interior surfaces may be in the order of 5 seconds. During that time, the generator 64 may be pulsed at a frequency in the order of 100 Hz to apply, say, 500 power pulses to the containers, each pulse being in the order of 1 ms long. This may deposit barrier layers 16 having a thickness in the order of 200 Å. While being coated, the interior skins of the containers may reach a temperature of 120° C. However, the average temperature at the outside of the container may be only 100° C.

In accordance with the invention, then, temperature stabilization of the containers being processed is achieved through a combination of interacting events, namely the pulsing of the microwave energy, the brevity of the successive reactive gas deposition events and the length of the interval between the power pulses which allows for the dissipation of heat and hence the cooling of containers 10.

After barrier coatings 16 of the desired thickness have been deposited on the container walls, controller 110 turns off all of the valves, lowers elevator 46 to the position shown in phantom in FIG. 6 and opens gate 76 so that the just-processed batch of finished containers 10 can be moved to the exit chamber 72.

A container 10 with the wall structure 12' shown in FIG. 2B having a selected UV radiation blocking capability may be formed in the same way described above. The only difference is that the polymeric base layer 14 of the container wall 12' contains the radiation blocking particles 18. A layer 14 such as this and the process for making it are described in detail in the above-identified application, and therefore, will not be detailed here.

To fabricate a container 10 having the wall structure 12" depicted in FIG. 2C, the surfaces 14a and 14b of the base layer 14 of the container wall 12 are pre-conditioned as described above. Then, prior to applying the barrier coating 16 as described above, reactive gases such as tetraethyloxysilane (TEOS) and oxygen are introduced into the containers while they are exposed to electromagnetic energy as described above. These gases will react to form a relatively flexible layer of silicon dioxide on the interior surfaces 14b of the base layers 14. The injection of the gases and the application of the microwave energy are pulsed as described above to maintain precise control over the stoichiometry of the reacting gases and the temperature of the container walls so that uniform layers 22 of the requisite thickness, e.g., 500 Å, are deposited on the base layers 14 of the various containers.

Then, controller 110 initiates the purging of the coating chamber 52 and of the containers and commences the next stage of the coating process which is the deposition of the barrier layers 16. This is carried out in the same way described above for the FIGS. 2A and 2B wall structures except that the barrier layers are laid down on the interlayers 22 instead of on the base layers 14. Since the layers 22 have just been applied, their surfaces are chemically pristine and quite receptive to the barrier layer deposits: Resultantly, there is very intimate bonding of those layers.

After purging the coating chamber 52 and the containers of residual gases left from the deposition of the barrier layers 16, controller 110 initiates the final stage of the process which is the application of the abrasion-resistant protective top coating 26. This coating, which may be of silicon dioxide or aluminum oxide, is applied by injecting reactant gases into the containers in the presence of a plasma as described above. For the former material, the reactive gases may be TEOS and oxygen; for the latter material, those gases could be trimethylaluminum or tripropyloxyaluminum and oxygen. Preferably, the pulsing technique described above is used to maintain the proper stoichiometry of the reacting gases and to prevent overheating of the containers. After the layer 26 has built up to the desired thickness, e.g., 200 Å, controller 110 initiates a final purge of chamber 52 and of the finished containers 10 and then lowers the batch of containers so that they can be removed from the apparatus by opening gate 76 and advancing the tray 36 into the exit chamber 72.

Figure 9:
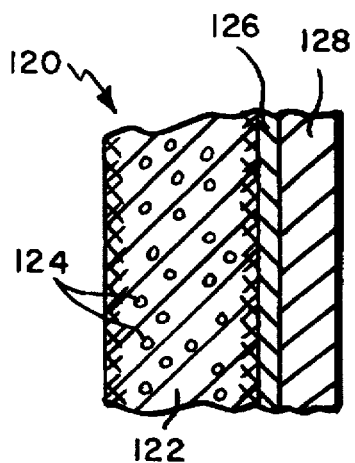
FIG. 9 is a fragmentary sectional view taken along 2—2 of FIG. 1 showing a container wall structure having an internal barrier layer.

While we have described our process in the context of coating the interior surfaces of an already formed container, the invention is also applicable to coating a polymeric base layer in sheet or strip form to form a plural-layer web which may then be formed into a container. FIG. 9, shows in crossection, a web 120 composed of several layers. The web includes a polymeric base layer 122 containing radiation blocking particles 124. Thus, the base layer is similar to the base layer 14' described in connection with FIG. 2B. Deposited on one of the surfaces of base layer 122 is a relatively thin inorganic barrier layer 126 which is impervious to gas and moisture despite its thinness. Barrier layer 126 may be of the same material as the layers 16 described in the FIGS. 2A to 2C wall structures. Covering the barrier layer 126 is a relatively thick protective layer 128. This layer prevents direct mechanical contact with the thin barrier layer 126 by keeping that layer sealed inside a sandwich structure to protect that layer 126 from damage during handling when the web 120 is subsequently formed into a container such as a pouch or package. Furthermore, because the layer 126 is thin and confined between the two layers 122 and 128, it is flexible allowing the web 120 to be formed into many different shapes while still maintaining the integrity of the barrier layer. Generally, layer 128 will provide the inside surface of the container. Therefore, that layer should be of a relatively inert aseptic thermoplastic material such as polyethylene or polyester. Also, being thermoplastic, the layer 128 may also perform a welding function for containers that have to be heat-sealed along their edges.

The FIG. 9 three-layer web 120 is much simpler than the six or seven layer laminates currently being used in the packaging industry. It is lighter in weight and should be less expensive and more readily disposable and recyclable than conventional multi-layer sheet structures. Furthermore, it may be transparent so that the contents of packaging made of the web 120 are readily observable. Yet, the structure performs a radiation blocking function to protect the contents of a container or package formed of the web 120 from UV radiation.

Figure 10:
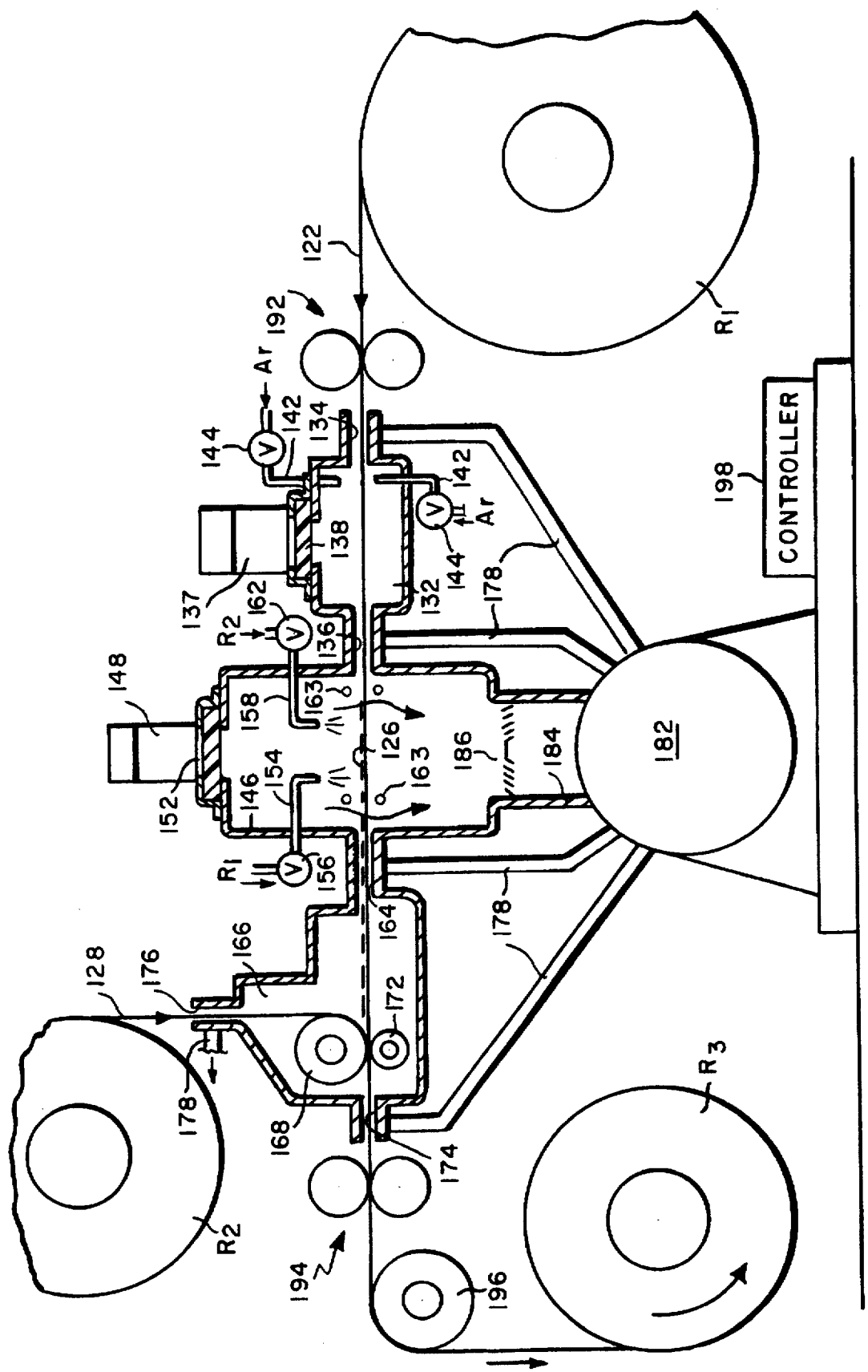
FIG. 10 is a view similar to FIG. 6, of apparatus for making a container having the FIG. 9 wall structure.

Refer now to FIG. 10 which illustrates apparatus for making the FIG. 9 web 120. Unlike the FIG. 6 apparatus, the FIG. 10 apparatus employs two different resonant cavities to first prepare, and then coat, the base layer. More particularly, the FIG. 10 apparatus includes a preparation chamber 132 with an airlock 134 at its entrance end and a second airlock 136 at its exit end. An RF generator 137 is mounted above chamber 132 and delivers microwave energy to the chamber by way of a port 138. An inert gas such as argon may be introduced into chamber 132 through a pair of pipes 142 with the flows of gas being controlled by valves 144.

The outlet airlock 136 from chamber 132 leads to a coating chamber 146 which is also a resonant cavity, receiving microwave energy from an RF generator 148 through a port 152 at the top of the chamber. Reactive gases $R_1$ and $R_2$ are introduced into chamber 146 by way of a first pipe 154 controlled by a valve 156 and a second pipe 158 controlled by a valve 162. Temperature sensors 163 monitor the temperature in that chamber.

The coating chamber 146 has an outlet airlock 164 which leads to a laminating chamber 166 containing a pair of heated laminating rolls 168 and 172, with the nip of the rolls being aligned with the airlock 164. Beyond those rolls is a second airlock 174 located at the exit end of chamber 166 and a third airlock 176 is present at the top of chamber 166.

All of the airlocks are connected by way of pipes 178 to a vacuum pump 182 at the bottom of the apparatus. Pump 182 is also connected directly to the coating chamber 146 by way of a duct 184 containing a filter 186 to prevent backstreaming into chamber 146.

A sheet 122 of the base layer material is drawn from a roll $R_1$ and guided by a guide roll couple 192 into the airlock 134 of chamber 132. Sheet 122 passes, via air locks 134, 136 and 164, through chamber 132 and chamber 146 into chamber 166 where it is fed into the nip of the laminating rolls 168 and 172. Also, fed to that nip is a sheet 128 of the protective material which is drawn from a roll $R_2$ and enters chamber 166 through airlock 176. The two laminated sheets 122 and 128 leave chamber 166 through airlock 174 and are guided by a guide roll couple 194 to a turn roll 196 which directs the webs to a driven make up roll $R_3$. A controller 198, which receives temperature signals from sensors 163, controls the operations of the RF generators 137 and 148, pump 182, the various valves and the rotation of the take up roll $R_3$ to carry out the steps of the process described above.

More particularly, as the base layer sheet 122 passes through chamber 132, controller 198 releases argon gas into the chamber while exposing the gas to microwave radiation from the generator 136. Resultantly, a plasma is formed which bombards both surfaces of the sheet 122 with ions thereby cleaning those surfaces and making them receptive to CVD coating in the coating chamber 146.

As the sheet 122 passes through the coating chamber 146, controller 198 controls valves 156 and 162 so that the reactant gases $R_1$ and $R_2$ are injected into the chamber in high frequency pulses. At the same time, the controller 198 controls the microwave generator 148 so that microwave energy is pulsed into the chamber in synchronism with the gas pulses. Resultantly, the pre-treated upper surface of sheet 122 is exposed to a compound vapor of precise stoichiometry which vapor becomes deposited uniformly on that surface without the sheet becoming overheated thereby forming the barrier layer 126. Controller 198 controls the transit time of the sheet through the chamber 146 so that a barrier layer 126 of the desired thickness is deposited on sheet 122.

The thus coated sheet 122 then passes into the laminating chamber 166 where it is fused to the sheet 128 of protective material by the heated laminating rolls 168 and 172. Upon leaving the laminating chamber 166, the thus-formed multi-layer web 120 cools and is wound up on the take up roll $R_3$.

Using an apparatus similar to the one depicted in FIG. 10, webs having a variety of different functional layers may be fabricated. For example, the laminating chamber. 166 may be replaced by a second coating chamber similar to chamber 146 so as to apply two functional coatings or layers to the sheet 122 of base layer material. Accordingly, it should be understood that certain changes may be made in carrying out the above process, in the described product and in the apparatus set forth without departing from the scope of the invention. Therefore, it is intended that all matter contained in the above description or shown in the accompanying drawings, shall be interpreted as illustrative and not in a limiting sense.

It is also to be understood that the following claims are intended to cover all of the generic and specific features of the invention described herein.

We claim:

1. A method of making a gas-impermeable container wall structure comprising steps of providing a base layer of an organic polymeric material;

conducting a plurality of reactive gases to the surface of the base layer, supplying enough electromagnetic energy to the gases to create a plasma which causes chemical reaction of said gases to form an inorganic vapor compound which becomes deposited on said surface;

pulsing the conducting and supplying steps at a selected frequency to control the temperature and stoichiometry of the deposited vapor compound, and continuing the conducting and supplying steps until the vapor compound deposit on said surface forms a coherent, strongly adherent gas-impermeable, chemically inert barrier layer of the desired thickness on said surface.

2. The method defined in claim 1 including the steps of
forming said barrier layer of a material selected from the group consisting of crystalline silicon, amorphous silicon and hydrogenated amorphous silicon, and
controlling the thickness of said barrier layer so that said barrier layer blocks electromagnetic radiation below a selected cutoff wavelength.

3. The method defined in claim 1 including the step of covering said barrier layer with a relatively thin top layer of a hard, abrasion-resistant material.

4. The method defined in claim 1 including the additional step of, prior to the conducting step, flowing an inert gas to said surface and ionizing the inert gas to subject said surface to ionic bombardment in order to clean said surface and render it receptive to said vapor compound.

5. The method defined in claim 4 including the additional step of depositing a plasticizer on said surface during said ionic bombardment so that the molecules of the plasticizer become crosslinked and form a coherent skin on said surface.

6. The method defined in claim 1 including the step of forming the base layer into a container before the conducting step.

7. The method defined in claim 1 including the step of forming said structure into a container after the continuing step.

8. The method defined in claim 1 wherein the providing step includes providing a base layer containing a dispersal of tiny radiation blocking particles of an inorganic semiconductor material which prevents the transmission through said wall structure of selected electromagnetic radiation frequencies.

9. A method of making a gas-impermeable container wall structure comprising the steps of providing a container of an organic polymeric dielectric material;

creating a relatively high vacuum in the container;

injecting a plurality of inorganic reactive gases into said container;

exposing the container and its contents to microwave energy sufficient to ionize said gases and produce a plasma in the container which causes chemical reaction of said gases thereby forming an inorganic vapor compound which becomes deposited on the interior wall of the container;

pulsing the injecting and exposing steps at a selected frequency to control the temperature and stoichiometry of this deposited vapor compound, and continuing the injecting and exposing steps until the compound vapor deposit on said interior wall forms a gas-impermeable, chemically inert barrier layer of a selected thickness on said interior wall.

10. The method defined in claim 9 wherein, prior to the injecting step, flowing an inert gas into the container in the presence of said radiation so as to ionize the inert gas whereupon the gas ions impact and clean the interior wall and render it receptive to said vapor compound deposit.

11. The method defined in claim 9 including the steps of forming said barrier layer of a material selected from the group consisting of crystalline silicon, amorphous silicon and hydrogenated amorphous silicon, and controlling the thickness of said barrier layer so that said barrier layer blocks electromagnetic radiation below a selected cutoff wavelength.

12. Apparatus for making a gas-impermeable container wall structure comprising means for providing a base layer of an organic polymeric material;

means for conducting a plurality of reactive gases to the surface of the base layer;

means for supplying electromagnetic radiation of sufficient strength at said surface to create a plasma which causes chemical reaction of said gases to form an inorganic vapor compound which becomes deposited on said surface;

means for pulsing the conducting and supplying means to control the temperature and stoichiometry of the deposited vapor compound, and means for controlling the conducting and supplying means until the vapor compound deposit on said surface forms a coherent, strongly adherent gas-impermeable, chemically inert barrier layer of the desired thickness on said surface.

13. The apparatus defined in claim 12 including means for flowing an inert gas to said surface prior to conducting said reactive gases to said surface, and means for ionizing the ined gas to subject said surface to ionic bombardment in order to clean said surface and render it receptive to said vapor compound.

14. The apparatus defined in claim 13 including means for depositing a plasticizer on said surface during said ionic bombardment so that the molecules of the plasticizer become crosslinked and form a coherent skin on said surface.

15. The apparatus defined in claim 12 wherein the providing means provides a base layer containing a dispersal of tiny radiation blocking particles of an inorganic semiconductor material which prevents the transmission through said wall structure of selected electromagnetic radiation frequencies.

16. The apparatus defined in claim 12 and further including means for covering said barrier layer with a relatively thin top layer of a hard, abrasion-resistant material.

17. The apparatus defined in claim 12 wherein said barrier layer is of a material selected from the group consisting of crystalline silicon, amorphous silicon and hydrogenated amorphous silicon and is of a thickness to block electromagnetic radiation below a selected cutoff wavelength.

18. Apparatus for making a gas-impermeable container wall structure comprising means for providing a container of an organic polymeric dielectric material;

means for creating a relatively high vacuum in the container;

means for injecting a plurality of inorganic reactive gases into said container;

means for exposing the container and its contents to electromagnetic energy sufficient to ionize said gases and produce a plasma in the container which causes chemical reaction of said gases thereby forming an inorganic vapor compound which becomes deposited on the interior wall of the container, and means for controlling the injecting and exposing steps until the vapor compound deposited on said interior wall forms a coherent, strongly adherent gas-impermeable, chemically inert barrier layer of a selected thickness on said interior wall, said controlling means causing the injection of said plurality of gases into the container as injection pulses of a selected frequency and the exposure of the container and its content to said energy as energy pulses having said selected frequency.

19. The apparatus defined in claim 18 and further including means for flowing an inert gas into the container in the presence of said radiation prior to injecting the reactive gases into the container so as to ionize the inert gas whereupon the gas ions impact and clean the interior wall and render it receptive to said vapor compound deposit.

20. The apparatus defined in claim 18 wherein said barrier layer is of a material selected from the group consisting of crystalline silicon, amorphous silicon and hydrogenated amorphous silicon and is of a thickness to block electromagnetic radiation below a selected cutoff wavelength.

* * * * *